(12) United States Patent
Gadkaree

(10) Patent No.: US 7,619,283 B2
(45) Date of Patent: Nov. 17, 2009

(54) METHODS OF FABRICATING GLASS-BASED SUBSTRATES AND APPARATUS EMPLOYING SAME

(75) Inventor: Kishor Purushottam Gadkaree, Big Flats, NY (US)

(73) Assignee: Corning Incorporated, Corning, NY (US)

( * ) Notice: Subject to any disclaimer, the term of this patent is extended or adjusted under 35 U.S.C. 154(b) by 28 days.

(21) Appl. No.: 11/788,570

(22) Filed: Apr. 20, 2007

(65) Prior Publication Data

US 2008/0261054 A1    Oct. 23, 2008

(51) Int. Cl.
*H01L 27/01* (2006.01)
*H01L 27/12* (2006.01)
*H01L 31/0392* (2006.01)

(52) U.S. Cl. .................. 257/347; 257/200; 257/760; 257/E21.127; 257/E21.182; 257/E21.267; 257/E21.32

(58) Field of Classification Search ............. 257/347, 257/352, 200, 213, 649, 760
See application file for complete search history.

(56) References Cited

U.S. PATENT DOCUMENTS

| | | | |
|---|---|---|---|
| 5,374,564 A | 12/1994 | Bruel | 437/966 |
| 6,274,459 B1 | 8/2001 | Chan | |
| 7,176,528 B2 * | 2/2007 | Couillard et al. | 257/347 |
| 7,192,844 B2 * | 3/2007 | Couillard et al. | 438/458 |
| 7,399,681 B2 * | 7/2008 | Couillard et al. | 438/458 |
| 2004/0168718 A1 | 9/2004 | Nelles et al. | |
| 2007/0281440 A1 * | 12/2007 | Cites et al. | 438/458 |

FOREIGN PATENT DOCUMENTS

| | | |
|---|---|---|
| WO | 2005029576 A2 | 3/2005 |
| WO | 2007024549 A2 | 3/2007 |

* cited by examiner

*Primary Examiner*—David Nhu
(74) *Attorney, Agent, or Firm*—Bruce P. Watson; Matthew B. Dernier; Timothy M. Schaeberle

(57) ABSTRACT

Methods and apparatus provide for a glass or glass ceramic substrate, including: a bulk layer; an enhanced positive ion concentration layer; and a reduced positive ion concentration layer, wherein the enhanced positive ion concentration layer contains substantially all modifier positive ions from the reduced positive ion concentration layer as a result of migration, the substrate does not include any further material thereon.

17 Claims, 3 Drawing Sheets

METHODS OF FABRICATING GLASS-BASED SUBSTRATES AND APPARATUS EMPLOYING SAME

BACKGROUND

The present invention relates to the manufacture of a substrate, such as a glass substrate, that may be used in forming a semiconductor-on-insulator (SOI) structure.

To date, the semiconductor material most commonly used in semiconductor-on-insulator structures has been silicon. Such structures have been referred to in the literature as silicon-on-insulator structures and the abbreviation "SOI" has been applied to such structures. SOI technology is becoming increasingly important for high performance thin film transistors, solar cells, and displays, such as, active matrix displays. SOI structures may include a thin layer of substantially single crystal silicon (generally 0.1-0.3 microns in thickness but, in some cases, as thick as 5 microns) on an insulating material.

For ease of presentation, the following discussion will at times be in terms of SOI structures. The references to this particular type of SOI structure are made to facilitate the explanation of the invention and are not intended to, and should not be interpreted as, limiting the invention's scope in any way. The SOI abbreviation is used herein to refer to semiconductor-on-insulator structures in general, including, but not limited to, silicon-on-insulator structures. Similarly, the SiOG abbreviation is used to refer to semiconductor-on-glass structures in general, including, but not limited to, silicon-on-glass structures. The SiOG nomenclature is also intended to include semiconductor-on-glass-ceramic structures, including, but not limited to, silicon-on-glass-ceramic structures. The abbreviation SOI encompasses SiOG structures.

Various ways of obtaining SOI structures wafer include epitaxial growth of silicon (Si) on lattice matched substrates. An alternative process includes the bonding of a single crystal silicon wafer to another silicon wafer on which an oxide layer of $SiO_2$ has been grown, followed by polishing or etching of the top wafer down to, for example, a 0.05 to 0.3 micron layer of single crystal silicon. Further methods include ion-implantation methods in which either hydrogen or oxygen ions are implanted either to form a buried oxide layer in the silicon wafer topped by Si in the case of oxygen ion implantation or to separate (exfoliate) a thin Si layer to bond to another Si wafer with an oxide layer as in the case of hydrogen ion implantation.

The former two methods have not resulted in satisfactory structures in terms of cost and/or bond strength and durability. The latter method involving hydrogen ion implantation has received some attention and has been considered advantageous over the former methods because the implantation energies required are less than 50% of that of oxygen ion implants and the dosage required is two orders of magnitude lower.

U.S. Pat. No. 5,374,564 discloses a process to obtain a single crystal silicon film on a substrate using a thermal process. A silicon wafer having a planar face is subject to the following steps: (i) implantation by bombardment of a face of the silicon wafer by means of ions creating a layer of gaseous micro-bubbles defining a lower region of the silicon wafer and an upper region constituting a thin silicon film; (ii) contacting the planar face of the silicon wafer with a rigid material layer (such as an insulating oxide material); and (iii) a third stage of heat treating the assembly of the silicon wafer and the insulating material at a temperature above that at which the ion bombardment was carried out. The third stage employs temperatures sufficient to bond the thin silicon film and the insulating material together, to create a pressure effect in the micro-bubbles and to result in a crystalline rearrangement, and to cause a separation between the thin silicon film and the remaining mass of the silicon wafer. (Due to the high temperature steps, this process does not work effectively with lower cost glass or glass-ceramic substrates.)

U.S. Pat. No. 7,176,528 discloses a process that produces an SiOG structure. The steps include: (i) exposing a semiconductor wafer (e.g., a silicon wafer) surface to hydrogen and/or helium ion implantation to create a bonding surface; (ii) bringing the bonding surface of the wafer into contact with a glass substrate; (iii) applying pressure, temperature and voltage to the wafer and the glass substrate to facilitate bonding therebetween; and (iv) cooling the structure to a common temperature to facilitate separation of the glass substrate and a thin layer of silicon from the silicon wafer.

The resulting SOG structure includes a glass or glass ceramic substrate having a bulk layer, an enhanced positive ion concentration layer, and a reduced positive ion concentration layer. The enhanced positive ion concentration layer contains positive ions from the reduced positive ion concentration layer as a result of migration. An oxide layer is located between the reduced positive ion concentration layer of the substrate and the thin layer of silicon from the silicon wafer. The reduced positive ion concentration layer is stable over time even if the SOG structure is heated to an elevated temperature comparable to, or even to some extent higher than, that used in the bonding process. Having been formed at an elevated temperature, reduced positive ion concentration layer is especially stable at the normal operating and formation temperatures of SOG structures. These considerations ensure that alkali and alkaline-earth ions will not diffuse back from the oxide glass or oxide glass-ceramic into the silicon layer during use or further device processing.

While the barrier functionality (preventing positive ion migration back from the oxide glass or oxide glass-ceramic, through the reduced positive ion concentration layer, and into the silicon layer) is desirable in some applications, the cost to achieve the bulk layer, the enhanced positive ion concentration layer, and the reduced positive ion concentration layer in the glass substrate is substantial. Indeed, the process described in U.S. Pat. No. 7,176,528 requires the bonding of some type of semiconductor material onto the glass substrate, and at least a portion of the semiconductor material remaining as part of the final structure.

It has been discovered, however, that a more economical approach to producing the bulk layer, the enhanced positive ion concentration layer, and the reduced positive ion concentration layer in the substrate may be achieved using various embodiments of the present invention.

SUMMARY OF THE INVENTION

Various aspects of the present invention have applicability in forming and using a glass substrate for deposition of semiconductor (e.g., silicon) films for applications involving thin film transistor (TFT) devices, such as high performance displays, electronics, photovoltaic devices, etc. When using glass substrates in these applications, there is significant concern over potential contamination of the silicon film from mobile ions within the glass substrate. Indeed, such contamination may strongly affect the TFT performance. In conventional structures, a silica or silicon oxynitride layer is deposited on the glass substrate via a vapor deposition process, which oxynitride layer prevents migration of constituents from the glass substrate into the silicon film. Such an oxynitride layer, however, may not be as effective as desired in every present or future application.

In accordance with one or more aspects of the present invention, a process for forming a barrier layer on a glass substrate (for preventing migration of positive ions from the oxide glass or oxide glass-ceramic into the silicon layer) includes: cleaning a glass or glass ceramic wafer to remove particulate matter, organics or other impurities; coating or contacting the glass with a conductive or semi-conductive material (such as amorphous silicon, aluminum, or other conductive metal); and subjecting the (semi) conductive material—glass structure to increased temperature, voltage potential, and if needed, pressure to maintain intimate contact therebetween.

It is noted that the voltage potential is applied across the glass substrate and (semi) conductive material such that the (semi) conductive material is connected to a positive electrode and the glass substrate (backside) is connected to a negative electrode. Application of desirable voltage and temperature is determined by the glass substrate and (semi) conductive material compositions, such that movement of ions in the glass substrate is achieved. Typically, the temperature is within about +/−300° C. of the strain point of the glass. This temperature also causes at least a portion of the (semi) conductive material to oxidize and form an oxide layer on the glass substrate. The amount of the (semi) conductive material consumed in the oxide formation depends on the process parameters (temperature, time, voltage, etc.). If the deposited (semi) conductive material is too thick, i.e., is not fully consumed and converted to oxide during the process, then the remaining (semi) conductive material may be dissolved via acid, alkaline or other reactive solutions and washed off or otherwise removed.

Within the glass substrate, a region substantially devoid of mobile ions, but potentially containing network forming ions which are tightly bound in the network, forms as positive ions migrate away from the source of higher voltage potential (i.e., the (semi) conductive material). The positive ions migrate into a next region of the glass substrate, which achieves an enhanced concentration of ions. The remaining layer of the glass substrate is bulk glass.

It has been found that such a multilayer barrier layer structure, comprising the semiconductor oxide and the region substantially devoid of mobile ions, is highly thermally stable. The mobile ions in the enhanced region of the glass substrate cannot breach the region substantially devoid of mobile ions, even after extended thermal treatments at elevated temperatures. The thickness of the multilayer barrier is controlled by any of the following parameters: temperature (the higher the temperature the faster the ion movement), the magnitude of the applied voltage potential, and time at the temperature and voltage.

The formation of the multilayer barrier coated glass substrate may be carried out in nitrogen, air, or a reducing atmosphere. An air atmosphere during the bonding process allows use of inexpensive, simple equipment for manufacture and increases the likelihood of producing a commercially viable product.

In accordance with one or more embodiments of the present invention, a method of forming a layered substrate includes: contacting a conductive or semi-conductive, cover material to a glass or glass ceramic substrate; applying heat to at least one of the cover material and the substrate; applying a voltage potential across the cover material and the substrate such that a voltage of the cover material is higher than a voltage of the substrate; maintaining the contact, heat, and voltage such that: (i) an oxide layer forms on the substrate between the cover material and the substrate; and (ii) positive ions of the substrate, including substantially all modifier positive ions, migrate away from the higher voltage potential of the cover material, forming: (1) a reduced positive ion concentration layer in the substrate adjacent the cover material; and (2) an enhanced positive ion concentration layer of the substrate adjacent the reduced positive ion concentration layer; discontinuing application of the force, heat and voltage; and removing the cover material from the substrate, resulting in a structure comprising the oxide layer, the reduced positive ion concentration layer, the enhanced positive ion concentration layer, and bulk substrate.

In alternative embodiments, the cover layer (or a portion thereof) may remain on the substrate.

The positive ions of the substrate, which migrate away from the reduced positive ion concentration layer to the enhanced positive ion concentration layer, include at least one alkali/alkaline earth modifier ion. The migration of positive ions results in substantial depletion of all alkali/alkaline-earth ions from the reduced positive ion concentration layer. The alkali/alkaline-earth ions include at least one of: $Li^{+1}$, $Na^{+1}$, $K^{+1}$, $Cs^{+1}$, $Mg^{+2}$, $Ca^{+2}$, $Sr^{+2}$, and/or $Ba^{+2}$. The migration of positive ions results in the reduced modifier positive ion concentration layer including one or more network forming ions.

The cover layer may be one of a metal and a semiconductor, which may be applied as a coating, e.g., via chemical vapor deposition, sputtering, e-beam evaporation, thermal evaporation, electro-deposition, or electrochemical deposition. Alternatively, the cover layer may be applied as wafer held in contact with the substrate using a mechanical force.

The methods and apparatus may further provide for a material layer on the oxide layer. The material layer may be taken from the group consisting of: single crystal semiconductor material, amorphous semiconductor material, and polycrystalline semiconductor material. The methods and apparatus may further provide for annealing the amorphous semiconductor material to form polycrystalline semiconductor material. The semiconductor material may be taken from the group consisting of: silicon (Si), germanium-doped silicon (SiGe), silicon carbide (SiC), germanium (Ge), gallium arsenide (GaAs), GaP, and InP.

Other aspects, features, advantages, etc. will become apparent to one skilled in the art when the description of the invention herein is taken in conjunction with the accompanying drawings.

BRIEF DESCRIPTION OF THE DRAWINGS

For the purposes of illustrating the various aspects of the invention, there are shown in the drawings forms that are presently preferred, it being understood, however, that the invention is not limited to the precise arrangements and instrumentalities shown.

DETAILED DESCRIPTION OF THE PRESENT INVENTION

Figure 1:
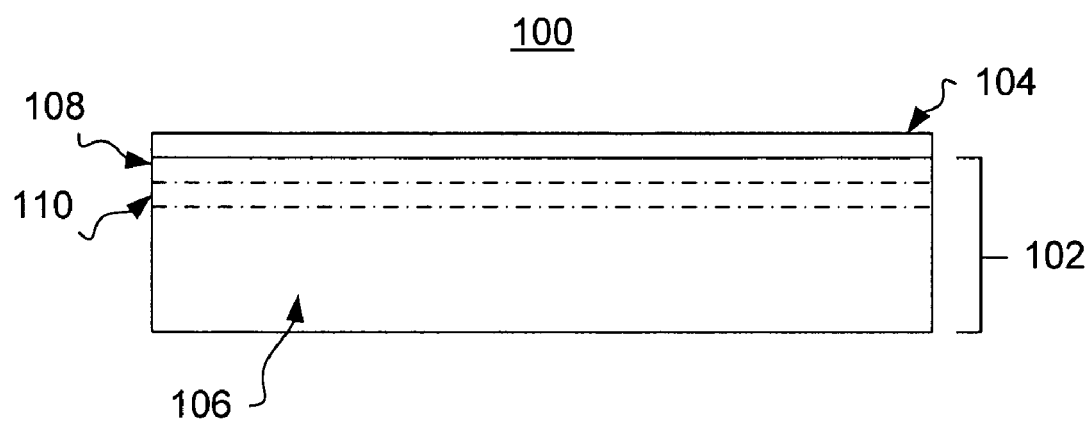
FIG. 1 is a block diagram illustrating the structure of an intermediate structure, a coated or layered glass substrate, that may be used in an SOI device in accordance with one or more embodiments of the present invention.
Figure 2:
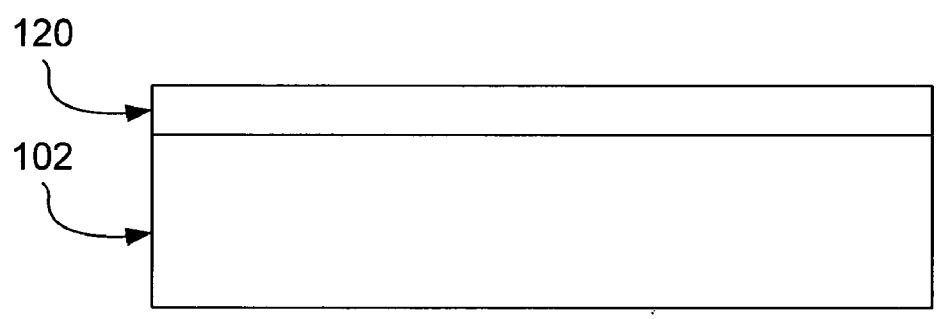
FIGS. 2-4 are block diagrams illustrating a process of forming other intermediate structures in connection with forming the coated or layered glass substrate structure of FIG. 1.

With reference to the drawings, wherein like numerals indicate like elements, there is shown in FIG. 1 a coated or layered glass substrate structure 100 (which may be referred to herein as the "glass substrate structure") in accordance with one or more embodiments of the present invention. The glass substrate structure 100 has suitable uses in connection with fabricating devices employing thin film transistors (TFTs), e.g., for display applications, including organic light-emitting diode (OLED) displays and liquid crystal displays (LCDs), integrated circuits, photovoltaic devices, etc.

The glass substrate structure 100 preferably includes a glass substrate 102, having layers 106, 108, 110, and one or more optional, additional layers, such as layer 104. The glass substrate 102 is preferably formed from an oxide glass or an oxide glass-ceramic. Although not required, the embodiments described herein preferably include an oxide glass or glass-ceramic exhibiting a strain point of less than about 1,000 degrees C. As is conventional in the glass making art, the strain point is the temperature at which the glass or glass-ceramic has a viscosity of $10^{14.6}$ poise ($10^{13.6}$ Pa.s). As between oxide glasses and oxide glass-ceramics, the glasses are presently preferred because they are typically simpler to manufacture, thus making them more widely available and less expensive.

By way of example, the glass substrate 102 may be formed from glass substrates containing alkaline-earth ions, such as, substrates made of CORNING INCORPORATED GLASS COMPOSITION NO. 1737 or CORNING INCORPORATED GLASS COMPOSITION NO. EAGLE 2000™. These glass materials have particular use in, for example, the production of liquid crystal displays.

The glass substrate preferably has a thickness in the range of about 0.1 mm to about 10 mm and most preferably in the range of about 0.5 mm to about 3 mm. For some applications, such as for use in some SOI structures, glass insulating layers having a thickness greater than or equal to about 1 micron are desirable, e.g., to avoid parasitic capacitive effects which arise when standard SOI structures having a silicon/silicon dioxide/silicon configuration are operated at high frequencies. In the past, such thicknesses have been difficult to achieve. In accordance with the present invention, an SOI structure having an insulating layer thicker than about 1 micron is readily achieved by simply using a glass substrate 102 having a thickness that is greater than or equal to about 1 micron. A preferred lower limit on the thickness of the glass substrate 102 is thus about 1 micron.

In general, the glass substrate 102 should be thick enough to support whatever additional layers, such as layer 104, a semiconductor layer, etc., through the process steps of the invention, as well as subsequent processing performed to produce a final structure, which may be an SOG structure. Although there is no theoretical upper limit on the thickness of the glass substrate 102, a thickness beyond that needed for the support function or that desired for the final structure is generally not preferred since the greater the thickness of the glass substrate 102, the more difficult it might be to accomplish at least some of the process steps.

The oxide glass or oxide glass-ceramic substrate 102 is preferably silica-based. Thus, the mole percent of $SiO_2$ in the oxide glass or oxide glass-ceramic is preferably greater than 30 mole % and most preferably greater than 40 mole %. In the case of glass-ceramics, the crystalline phase can be mullite, cordierite, anorthite, spinel, or other crystalline phases known in the art for glass-ceramics. Non-silica-based glasses and glass-ceramics may be used in the practice of one or more embodiments of the invention, but are generally less preferred because of their higher cost and/or inferior performance characteristics. Similarly, for some applications, e.g., for SOI structures employing semiconductor materials that are not silicon-based, glass substrates which are not oxide based, e.g., non-oxide glasses, may be desirable, but are generally not preferred because of their higher cost.

For certain applications, e.g., display applications, the glass or glass-ceramic 102 is preferably transparent in the visible, near UV, and/or IR wavelength ranges, e.g., the glass or glass ceramic 102 is preferably transparent in the 350 nm to 2 micron wavelength range.

Although the glass substrate 102 is preferably composed of a single glass or glass-ceramic, laminated structures can be used if desired. When laminated structures are used, the layer of the laminate closest to the optional layer 104 preferably has the properties discussed herein for a glass substrate 102 composed of a single glass or glass-ceramic. Layers farther from the optional layer 104 preferably also have those properties, but may have relaxed properties because they do not directly interact with the optional layer 104. In the latter case, the glass substrate 102 is considered to have ended when the properties specified for a glass substrate 102 are no longer satisfied.

Reference is now made to FIGS. 2-5, which illustrate structures achieved by carrying out process steps in accordance with one or more embodiments of the present invention. With specific reference to FIG. 2, the glass substrate 102 is cleaned and any suitable surface preparation steps are carried out. Thereafter, a conductive or semi-conductive, cover layer 120 is coated on (or placed in contact with) the glass or glass ceramic substrate 102. The cover layer 120 may be a suitable metal (such as aluminum), a semiconductor material (such as silicon), etc. In the case of $Al_2O_3$, or other metal material, the cover layer 120 may be applied to the glass substrate 102 as a coating using any of the known techniques, such as chemical vapor deposition, sputtering, e-beam evaporation, thermal evaporation, electro-deposition, and electrochemical deposition. Alternatively, in the case of the cover layer 120 being a semiconductor wafer, such wafer may be held in contact with the glass substrate 102 using a mechanical force.

Figure 3:
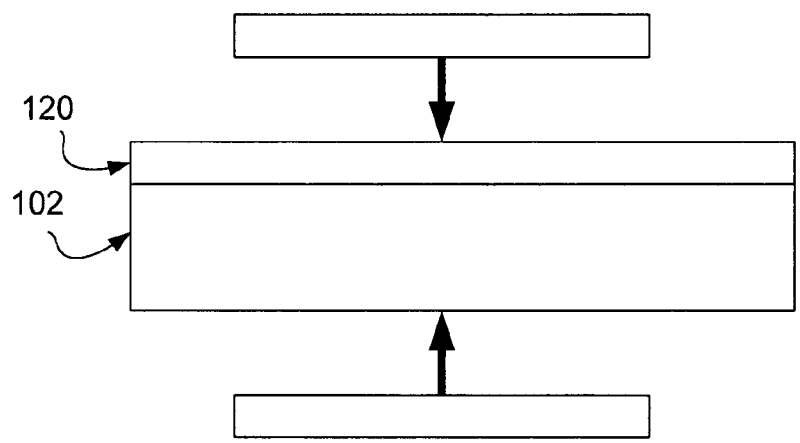

With reference to FIG. 3, the glass substrate 102 and cover layer 120 are then subject to an electrolysis process. A preferred electrolysis bonding process is described in U.S. Pat. No. 7,176,528, the entire disclosure of which is hereby incorporated by reference. Portions of this process are discussed below, however, the basic process involves subjecting the glass substrate 102 and cover layer 120 to temperature, voltage, and pressure for some period of time.

The glass substrate 102 and cover layer 120 are heated, preferably to a temperature within about +/−150 degrees C. of the strain point of the glass substrate 102. In the case of a cover layer 120 coating, like aluminum or silicon the elevated temperature of the glass substrate 102 and cover layer 120 may be basically the same. However, a differential temperature gradient between the glass substrate 102 and cover layer 120 may be desirable in some circumstances, such as in embodiments when separation of the cover layer 120 via exfoliation is desired. For example, when the cover layer 120 is a semiconductor wafer, the glass substrate 102 may be heated to a higher temperature than the cover layer 120. Depending on material choices, the temperature difference between the glass substrate 102 and the cover layer 120 may be at least 10 degrees C., although the difference may be as high as about 100 to about 150 degrees C. This temperature differential is desirable for a glass having a coefficient of thermal expansion (CTE) matched to that of the semiconductor cover layer 120 (e.g., silicon) since it facilitates later separation of a portion of the semiconductor cover layer 120 due to thermal stresses.

Once the temperature of the glass substrate 102 and the cover layer 120 is stabilized, mechanical pressure may be applied to the intermediate assembly. The preferred pressure range is between about 1 to about 50 psi. Application of higher pressures, e.g., pressures above 100 psi, might cause breakage of the glass wafer. It is noted that the application of pressure may only be needed for cover layers 120 that are contacted (as opposed to coated) on the glass substrate 110. Indeed, substantial contact may be achieved by the coating process itself and mechanical pressure may not be needed.

Figure 4:
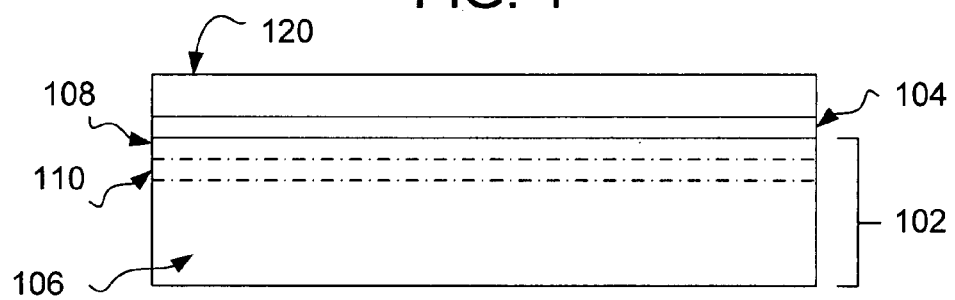

Next, a voltage is applied across the intermediate assembly, preferably with the cover layer 120 at the positive electrode and the glass substrate 102 the negative electrode. With reference to FIG. 4, the application of the voltage potential causes alkali or alkaline earth ions in the glass substrate 102 to move away from the cover layer/glass interface further into the glass substrate 102. More particularly, positive ions of the glass substrate 102, including substantially all modifier positive ions, migrate away from the higher voltage potential of the cover layer 120, forming: (1) a reduced positive ion concentration layer 108 in the glass substrate 102 adjacent the cover layer 120; and (2) an enhanced positive ion concentration layer 110 of the glass substrate 102 adjacent the reduced positive ion concentration layer 108.

The intermediate assembly is held under these conditions (pressure, temperature, and voltage) for some time, e.g., approximately 1 hr or less. This accomplishes a number of functions: (i) an alkali or alkaline earth ion free interface (or layer) 108 is created in the glass substrate 102; (ii) an alkali or alkaline earth ion enhanced interface (or layer) 110 is created in the glass substrate 102; (iii) an oxide layer 104 is created between the cover layer 120 and the glass substrate 102; and (iv) the glass substrate 102 becomes very reactive and bonds to the cover layer 120 strongly with the application of heat at relatively low temperatures.

Thereafter, the voltage is removed and the intermediate assembly is allowed to cool to room temperature. In the example illustrated in FIG. 4, the intermediate structure resulting from the electrolysis process includes, in order: the bulk glass substrate 106 (in the glass substrate 102); the enhanced alkali or alkaline earth ion layer 110 (in the glass substrate 102); the reduced alkali or alkaline earth ion layer 108 (in the glass substrate 102); the oxide layer 104; and the cover layer 120.

The amount of the cover layer 120 material consumed in the oxide layer 104 formation depends on the process parameters (temperature, time, voltage, etc.). Thus, there are various possible scenarios concerning the amount of cover layer 120 material consumed during oxidation and remaining thereafter. If the deposited cover layer 120 is relatively thick, i.e., is not fully consumed and converted to oxide during the process, then the remaining cover layer 120 material after oxidation may be retained or partially or fully removed, total removal being preferred. In the case of a metal cover layer 120 material, the remaining material (if any) may be dissolved via acid, alkaline or other reactive solutions and washed off or otherwise removed. In the case of a semiconductor material as the cover layer 120, at least a portion, but preferably all, of the semiconductor material may be removed (or separated).

Details as to how such separation may be achieved may be found in U.S. Pat. No. 7,176,528. Any remaining semiconductor material may be removed or otherwise processed. Another possibility is that all of the cover layer 120 material is consumed during oxidation.

Especially in the case of a metal cover layer 120, which has been completely removed, there is utility for the resulting intermediate structure as shown in FIG. 1. It is contemplated that such a structure 100 may subjected to the application of additional layers on the oxide layer 104 as needed to achieve a desired device.

Figure 5:
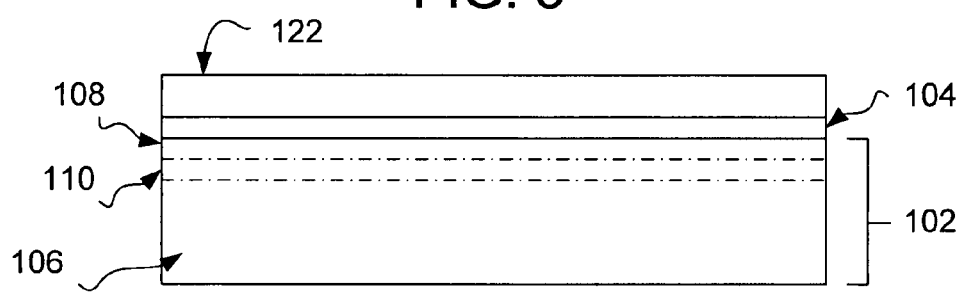
FIG. 5 is a block diagram illustrating an SOI device formed using the coated or layered glass substrate structure of FIG. 1.

By way of example, as shown in FIG. 5, a layer of semiconductor material layer 122 may be applied to the oxide layer 104 to form an SOI device. The semiconductor material layer 122 may be created via chemical vapor deposition, sputtering, e-beam evaporation, thermal evaporation, or other suitable processes. The semiconductor material 122 may be taken from the group consisting of: single crystal semiconductor material, amorphous semiconductor material, and polycrystalline semiconductor material. The specific semiconductor material may be taken from the group consisting of: silicon (Si), germanium-doped silicon (SiGe), silicon carbide (SiC), germanium (Ge), gallium arsenide (GaAs), GaP, and InP. If, for example, amorphous semiconductor material is used as the semiconductor material layer 122, one or more embodiments of the invention may include annealing the amorphous semiconductor material to form polycrystalline semiconductor material as the layer 122.

In some embodiments it may be economical to employ a cover layer 120 of semiconductor material (such as amorphous silicon), and not completely remove the residual semiconductor material post electrolysis. Thereafter, the remaining amorphous semiconductor layer may be crystallized to obtain a polysilicon layer on top of the oxide 104 layer, and barrier layers 108, 110.

Some structural details of the various layers of the glass substrate 102 will now be described. The electrolysis process transforms the interface between the cover layer 120 and the glass substrate 102 into an interface region comprising layer 108 (which is a positive ion depletion region) and layer 110 (which is a positive ion enhancement region). The interface region may also include one or more positive ion pile-up regions in the vicinity of the distal edge of the positive ion depletion layer 108.

The positive ion enhancement layer 110 is of enhanced oxygen concentration and has a thickness of T160. This thickness may be defined in terms of a reference concentration for oxygen at a reference surface (not shown) above the glass substrate 102. The reference surface is substantially parallel to the bonding surface between the glass substrate 102 and the cover layer 120 and is separated from that surface by a distance DS1. Using the reference surface, the thickness T160 of the positive ion enhancement layer 110 will typically satisfy the relationship:

$$T160 < 200 \text{ nm},$$

where T160 is the distance between bonding surface and a surface which is: (i) substantially parallel to bonding surface, and (ii) is the surface farthest from bonding surface for which the following relationship is satisfied:

$$CO(x)\text{-}CO/Ref \leq 50 \text{ percent}, \ 0 \leq x \leq T160,$$

where CO(x) is the concentration of oxygen as a function of distance x from the bonding surface, CO/Ref is the concentration of oxygen at the above reference surface, and CO(x) and CO/Ref are in atomic percent.

Typically, T160 will be substantially smaller than 200 nanometers, e.g., on the order of about 50 to about 100 nanometers. It should be noted that CO/Ref will typically be zero, so that the above relationship will in most cases reduce to:

CO($x$)≧50 percent, 0≦$x$≦$T$160.

In connection with the positive ion depletion layer 108, the oxide glass or oxide glass-ceramic substrate 102 preferably comprises at least some positive ions that move in the direction of the applied electric field, i.e., away from the bonding surface and into the layer 110 of the glass substrate 102. Alkali ions, e.g., $Li^{+1}$, $Na^{+1}$, and/or $K^{+1}$ ions, are suitable positive ions for this purpose because they generally have higher mobilities than other types of positive ions typically incorporated in oxide glasses and oxide glass-ceramics, e.g., alkaline-earth ions. However, oxide glasses and oxide glass-ceramics having positive ions other than alkali ions, e.g., oxide glasses and oxide glass-ceramics having only alkaline-earth ions, can be used in the practice of the invention. The concentration of the alkali and alkaline-earth ions can vary over a wide range, representative concentrations being between 0.1 and 40 wt. % on an oxide basis. Preferred alkali and alkaline-earth ion concentrations are 0.1 to 10 wt. % on an oxide basis in the case of alkali ions, and 0-25 wt. % on an oxide basis in the case of alkaline-earth ions.

The electric field applied in the electrolysis process moves the positive ions (cations) further into the glass substrate 102 forming the positive ion depletion layer 108. The formation of the positive ion depletion layer 108 is especially desirable when the oxide glass or oxide glass-ceramic contains alkali ions, since such ions are known to interfere with the operation of semiconductor devices. Alkaline-earth ions, e.g., $Mg^{+2}$, $Ca^{+2}$, $Sr^{+2}$, and/or $Ba^{+2}$, can also interfere with the operation of semiconductor devices and thus the depletion region also preferably has reduced concentrations of these ions.

It has been found that the positive ion depletion layer 108 once formed is stable over time even if the SOG structure 100 is heated to an elevated temperature comparable to, or even to some extent higher than, that used in the electrolysis process. Having been formed at an elevated temperature, the positive ion depletion layer 108 is especially stable at the normal operating and formation temperatures of SOG structures. These considerations ensure that alkali and alkaline-earth ions will not diffuse back from the oxide glass or oxide glass-ceramic 102 into any semiconductor material that may be later applied to the glass substrate 102 directly or to the oxide layer 104, during use or further device processing, which is an important benefit derived from using an electric field as part of the electrolysis process.

The operating parameters needed to achieve the positive ion depletion layer 108 of a desired width and a desired reduced positive ion concentration for all of the positive ions of concern can be readily determined by persons skilled in the art from the present disclosure. When present, the positive ion depletion layer 108 is a characteristic feature of an SOG structure produced in accordance with one or more embodiments of the present invention.

EXAMPLE 1

Example—Aluminum metal was sputter deposited to a thickness of 0.5 microns on a clean glass substrate. The coated substrate was then mounted in a setup to apply a voltage potential across the layered structure. The aluminum metal was connected to the positive electrode and the uncoated side of the glass substrate was connected to the negative electrode. The temperature of the coated glass substrate was increased to 550° C. and a potential of 1500 Volts was applied thereacross. The hold time under this condition was 20 minutes. Then the voltage was reduced to zero and the coated glass substrate was slowly cooled. Some part of the aluminum was oxidized to alumina thus forming a 0.1 micron alumina layer. The remaining aluminum was removed via wet etching after the coated glass substrate cooled, thus forming a strongly adhered alumina layer on the glass substrate.

EXAMPLE 2

In the following example, barrier layer formation was achieved with a silicon cover layer. A silicon wafer of 100 mm in diameter and 100 microns thick was hydrogen ion implanted at a dosage of 8×10*16 ions/cm2 and an implantation energy of 100 KeV. The silicon wafer was then treated in oxygen plasma to oxidize the surface groups thereof. An Eagle glass substrate of 100 mm in diameter was then washed with Fischer scientific Contrad 70 detergent in an ultrasonic bath for 15 minutes followed by a distilled water wash for 15 minutes in an ultrasonic bath and then washed in 10% nitric acid followed by a distilled water wash. The silicon wafer and the glass substrate were cleaned in a spin washer dryer with distilled water in a clean room. The silicon wafer and the glass substrate were inserted in a Suss Microtech bonder. The glass substrate was placed on the negative electrode and the silicon wafer was placed on the positive electrode and held away from the glass substrate with spacers. The structure was heated to 525 degrees C. (for the silicon wafer) and 575 degrees C. (for the glass substrate) in nitrogen and then brought in contact. A potential of 1750 Volts was applied across the silicon wafer and the glass substrate surfaces. The voltage was applied for 20 minutes, and then the voltage was brought to zero. The structure was then cooled to room temperature. The silicon wafer was separated easily from the glass substrate, leaving a thin layer of silicon bonded to the glass substrate. Excellent quality samples with strongly adhered thin silicon film (approximately 500 nm thick) on the glass substrate were obtained via this process. If it is desirable to remove the remaining silicon layer, such is easily dissolved in basic solutions such as KOH based solutions or acidic solutions.

EXAMPLE 3

Figure 6:
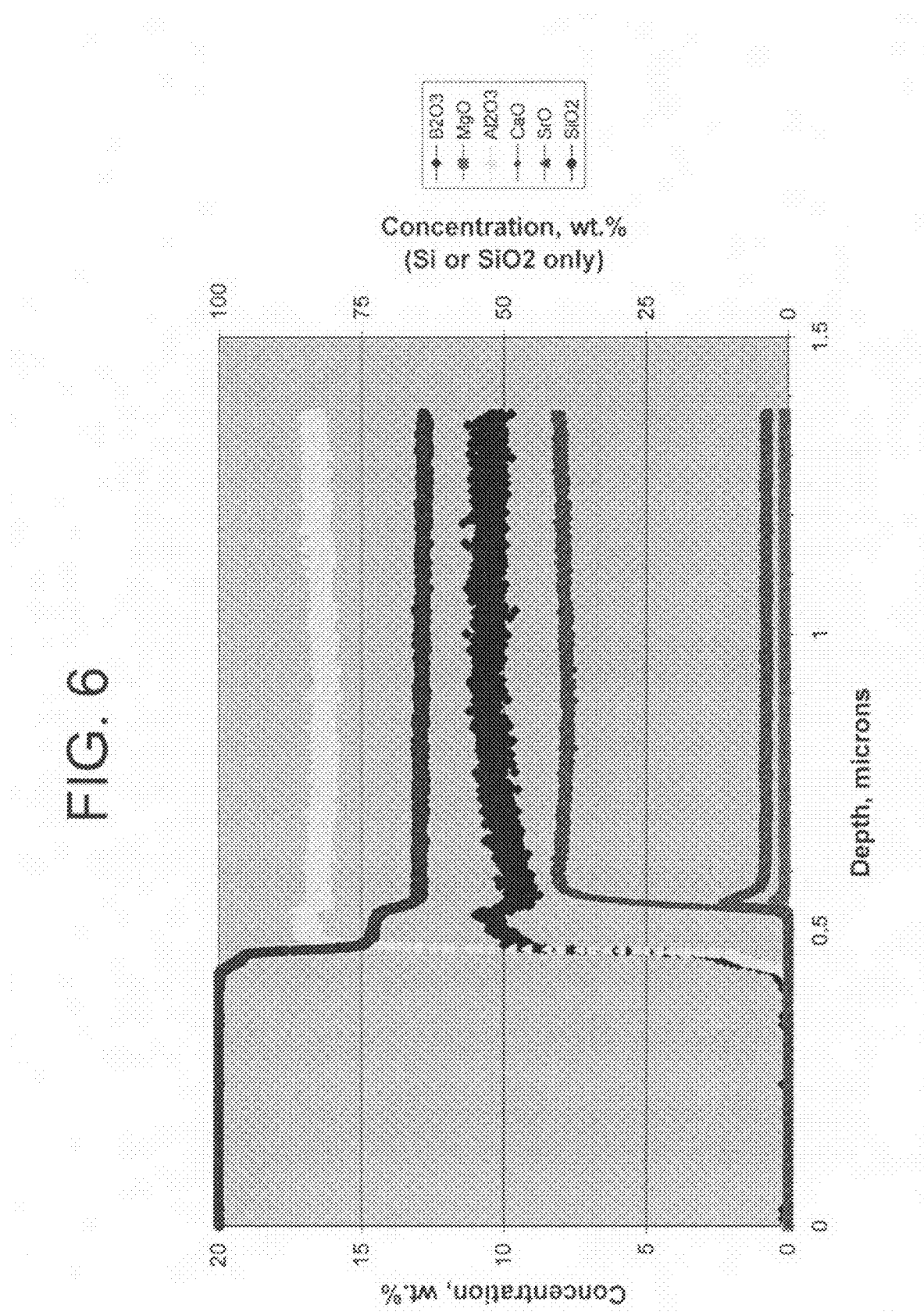
FIG. 6 is a graph showing the TOF-SIMS Depth Profile of an SOI structure formed using Corning's EAGLE 2000™ glass and a silicon layer using aspects of the present invention.

The experiment of Example 2 was repeated in an air atmosphere but with a potential of 1750 volts across the silicon wafer and glass substrate. Again excellent quality samples of silicon film on glass were obtained in this experiment, thereby proving that a high vacuum bonding process is not essential for the SiOG structures produced in accordance with the invention. FIG. 6 shows the TOF-SIMs analysis of the depleted and enhanced ion layers 108, 110 at the interface between the glass substrate and the silicon film indicating excellent barrier layer formation in this process. This data was obtained before removing the silicon layer.

EXAMPLE 4

In this experiment, the glass substrate and the silicon wafer (post cleaning) were brought into contact and any air pockets were eliminated via application of slight pressure. The glass substrate and silicon wafer were then placed between two steel electrodes with a graphoil sheet between the steel and the respective surfaces of the glass substrate and silicon wafer to allow electrical contact. The assembly was then placed in a standard air atmosphere furnace. Weight was placed on the steel plate to apply about 1 psi of pressure. The assembly was then heated in the furnace to 650 degrees C. An electric potential of 1750 volts was applied across the electrodes. After ten minutes the potential was removed and the furnace was allowed to cool. On disassembly, the glass substrate separated with a thin silicon film adhered thereto. This example demonstrates the use of very simple equipment for the bonding process. The TOF-SIMs analysis of this sample showed the barrier layer formation as in the Example 3 above (i.e., FIG. 6).

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. An apparatus, comprising:
    a glass or glass ceramic substrate, the glass or glass ceramic substrate including, in order, a bulk layer, an enhanced positive ion concentration layer, and a reduced positive ion concentration layer, where the enhanced positive ion concentration layer contains substantially all modifier positive ions from the reduced positive ion concentration layer as a result of migration; and
    a conductive or semiconductive oxide layer adjacent to the reduced positive ion concentration layer of the glass or glass ceramic substrate,
    wherein the apparatus does not include any further material on the oxide layer.

2. The apparatus of claim 1, wherein the enhanced positive ion concentration layer includes at least one alkali/alkaline earth modifier ion that has migrated away from the reduced positive ion concentration layer.

3. The apparatus of claim 2, wherein the reduced positive ion concentration layer is substantially depleted of all alkali/alkaline-earth ions.

4. The apparatus of claim 3, wherein the alkali/alkaline-earth ions include at least one of: $Li^{+1}$, $Na^{+1}$, $K^{+1}$, $Cs^{+1}$, $Mg^{+2}$, $Ca^{+2}$, $Sr^{+2}$, and/or $Ba^{+2}$.

5. The apparatus of claim 1, wherein the reduced modifier positive ion concentration layer includes one or more network forming ions.

6. A glass or glass ceramic substrate, comprising:
    a bulk layer;
    an enhanced positive ion concentration layer; and
    a reduced positive ion concentration layer,
    wherein the enhanced positive ion concentration layer contains substantially all modifier positive ions from the reduced positive ion concentration layer as a result of migration, the glass or glass ceramic substrate does not include any further material thereon.

7. A glass or glass ceramic substrate, comprising:
    an enhanced positive ion concentration layer; and
    a reduced positive ion concentration layer,
    wherein the enhanced positive ion concentration layer contains substantially all modifier positive ions from the reduced positive ion concentration layer as a result of migration, and the glass or glass ceramic substrate does not include any further material thereon.

8. The glass or glass ceramic substrate of claim 7, wherein the enhanced positive ion concentration layer includes at least one alkali/alkaline earth modifier ion that has migrated away from the reduced positive ion concentration layer.

9. The glass or glass ceramic substrate of claim 8, wherein the reduced positive ion concentration layer is substantially depleted of all alkali/alkaline-earth ions.

10. The glass or glass ceramic of claim 9, wherein the alkali/alkaline-earth ions include at least one of: $Li^{+1}$, $Na^{+1}$, $K^{+1}$, $Cs^{+1}$, $Mg^{+2}$, $Ca^{+2}$, $Sr^{+2}$, and/or $Ba^{+2}$.

11. The glass or glass ceramic substrate of claim 7, wherein the reduced modifier positive ion concentration layer includes one or more network forming ions.

12. The glass or glass ceramic substrate of claim 6, wherein the enhanced positive ion concentration layer includes at least one alkali/alkaline earth modifier ion that has migrated away from the reduced positive ion concentration layer.

13. The glass or glass ceramicsubstrate of claim 12, wherein the reduced positive ion concentration layer is substantially depleted of all alkali/alkaline-earth ions.

14. The glass or glass ceramicsubstrate of claim 13, wherein the alkali/alkaline-earth ions include at least one of: $Li^{+1}$, $Na^{+1}$, $K^{+1}$, $Cs^{+1}$, $Mg^{+2}$, $Ca^{+2}$, $Sr^{+2}$, and/or $Ba^{+2}$.

15. The glass or glass ceramic substrate of claim 6, wherein the reduced modifier positive ion concentration layer includes one or more network forming ions.

16. The glass or glass ceramic substrate of claim 12, wherein the reduced positive ion concentration layer is substantially depleted of all alkali/alkaline-earth ions.

17. The glass or glass ceramic substrate of claim 16, wherein the alkali/alkaline-earth ions include at least one of: $Li^{+1}$, $Na^{+1}$, $K^{+1}$, $Cs^{+1}$, $Mg^{+2}$, $Ca^{+2}$, $Sr^{+2}$, and/or $Ba^{+2}$.

* * * * *